(12) United States Patent
Laboutin et al.

(10) Patent No.: US 11,133,408 B2
(45) Date of Patent: Sep. 28, 2021

(54) DIELECTRIC PASSIVATION FOR LAYERED STRUCTURES

(71) Applicant: IQE plc, Cardiff (GB)

(72) Inventors: Oleg Laboutin, South Easton, MA (US); Xiang Gao, East Brunswick, NJ (US); Hugues Marchand, Somerville, MA (US)

(73) Assignee: IQE plc, Cardiff (GB)

( * ) Notice: Subject to any disclaimer, the term of this patent is extended or adjusted under 35 U.S.C. 154(b) by 205 days.

(21) Appl. No.: 16/533,363

(22) Filed: Aug. 6, 2019

(65) Prior Publication Data

US 2021/0043760 A1 Feb. 11, 2021

(51) Int. Cl.
*H01L 29/778* (2006.01)
*H01L 21/28* (2006.01)
*H01L 29/66* (2006.01)

(52) U.S. Cl.
CPC ...... *H01L 29/778* (2013.01); *H01L 21/28247* (2013.01); *H01L 29/66431* (2013.01)

(58) Field of Classification Search
CPC .............. H01L 29/2003; H01L 29/517; H01L 29/66431; H01L 29/778–7789; H01L 21/28264
See application file for complete search history.

(56) References Cited

U.S. PATENT DOCUMENTS

| 2004/0144991 | A1  | 7/2004 | Kikkawa |
| 2006/0011915 | A1* | 1/2006 | Saito ................... H01L 29/7786 257/65 |
| 2010/0117118 | A1* | 5/2010 | Dabiran ............... H01L 29/207 257/190 |
| 2011/0089469 | A1* | 4/2011 | Merckling ........ H01L 29/66462 257/201 |

(Continued)

FOREIGN PATENT DOCUMENTS

EP 2 600 404 6/2013

OTHER PUBLICATIONS

"Chemistry and electrical properties of surfaces of GaN and GaN/AlGaN heterostructures" Tamotsu Hashizume, Shinya Ootomo, Susumu Oyama, Masanobu Konishi, and Hideki Hasegawa, in J. Vac. Sci. Technol. B 19(4), Jul./Aug. 2001 (Year: 2001).*

(Continued)

*Primary Examiner* — Eric A. Ward
(74) *Attorney, Agent, or Firm* — Sterne, Kessler, Goldstein & Fox P.L.L.C.

(57) ABSTRACT

A passivated semiconductor device structure includes a III-nitride structure and a passivation layer. The III-nitride structure includes a high electron mobility transistor (HEMT). The passivation layer includes a dielectric, which is formed over the structure to provide passivation and forms an interface with the structure. The interface provides a transition between the structure and the dielectric having a thickness of at least two atomic layers. The interface also has (Continued)

a characteristic density of interface states less than a reference density of interface states that corresponds to a thickness of at most one atomic layer. The transition, which constitutes a rough interface, allows a relatively low density of interface states, and thus improves high-frequency performance of the device structure.

20 Claims, 5 Drawing Sheets

(56) References Cited

U.S. PATENT DOCUMENTS

| | | | | |
|---|---|---|---|---|
| 2011/0186855 | A1* | 8/2011 | Ramdani | H01L 21/28264 257/76 |
| 2013/0168690 | A1* | 7/2013 | Ikarashi | H01L 29/66462 257/76 |
| 2014/0346615 | A1* | 11/2014 | Zhang | H01L 29/78 257/411 |
| 2016/0079386 | A1* | 3/2016 | Aoki | H01L 21/02205 257/330 |

OTHER PUBLICATIONS

"Surface nitridation for improved dielectric/III-nitride interfaces in GaN MIS-HEMTs" by Kevin J. Chen, Shu Yang, Zhikai Tang, Sen Huang, Yunyou Lu, Qimeng Jiang, Shenghou Liu, Cheng Liu, and Baikui Li, in Phys. Status Solidi A 212, No. 5, 1059-1065 (2015) (Year: 2015).*

* cited by examiner

DIELECTRIC PASSIVATION FOR LAYERED STRUCTURES

BACKGROUND

Common methods of forming dielectrics include thermal oxidation, sputtering and chemical vapor deposition. Dielectrics formed using these methods typically have high material density, high electrical resistivity, and reasonable compatibility to the underlying semiconductor structure and metal contacts. $SiO_2$ is the most common dielectric in Si-based electronic devices. It has good compatibility with silicon but suffers from a low dielectric constant. Moreover, $SiO_2$ has poor compatibility with some other semiconductors such as III-nitrides.

Along with advances in device performance at higher frequencies, the dimensions of device structures are shrinking considerably, moving device active layers in closer proximity to dielectric layers. If a dielectric layer is in close proximity of the active layer, it is important for high-frequency operation of the device that the dielectric-to-semiconductor interface has a low density of interface defects. Those defects can form interface states, which can create a parasitic charge or trap existing charge carriers and thus slow down device operation. Chemical cleaning and plasma treatment of the semiconductor surface prior to dielectric deposition were recently suggested to improve the dielectric-semiconductor interface. Another technique aimed at improving the dielectric-semiconductor interface includes dielectric deposition in the same reactor chamber used for semiconductor deposition (i.e., so-called in-situ deposition). That technique enables a dielectric deposition immediately after semiconductor deposition without exposure of the semiconductor to air, thus avoiding surface contamination and formation of harmful native oxides. However, some defects and associated interface states may still exist at the in-situ-formed dielectric-semiconductor interfaces due to large stress and chemical mismatch between two adjacent materials.

SUMMARY

The present disclosure is directed to passivated semiconductor device structures. The device structures include a III-nitride high-electron-mobility transistor (HEMT) structure, and a dielectric layer formed over the structure to provide passivation. The interface between the dielectric layer and the structure includes a transition having a thickness of at least two atomic layers. The interface is also characterized as having a density of interface states less than a reference density of interface states that corresponds to a thickness of at most one atomic layer. For example, in some embodiments, the thickness of the interface is at least equal to 0.5 nanometers. In a further example, in some embodiments, the density of interface states is at most equal to $1 \times 10^{11}$ $cm^{-2}$.

In some embodiments, a preparatory layer is formed over the III-nitride structure to provide surface roughness for the dielectric layer. In some such embodiments, the preparatory layer and the dielectric layer form the interface having a thickness of at least two atomic layers and a density of interface states less than that corresponding to a thickness of at most one atomic layer.

BRIEF DESCRIPTION OF THE DRAWINGS

The present disclosure, in accordance with one or more various embodiments, is described in detail with reference to the following drawings. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

The present disclosure provides improved dielectric passivation layers. In some embodiments, the present disclosure provides improved passivated III-nitride high-electron-mobility transistor (HEMT) structure and methods of forming the same. The passivation layers are realized by forming a rough interface between the passivation layer and uppermost layer of a III-nitride HEMT structure. In an illustrative example, the passivation layer includes silicon nitride (SiN). In a further example, SiN may be deposited in-situ, in the same reactor chamber used to grow the underlying III-nitride HEMT structure. Other illustrative dielectrics include materials such as, for example, SiAlN, $SiO_2$, $Al_2O_3$, and $HfO_2$, among others.

Figure 1:
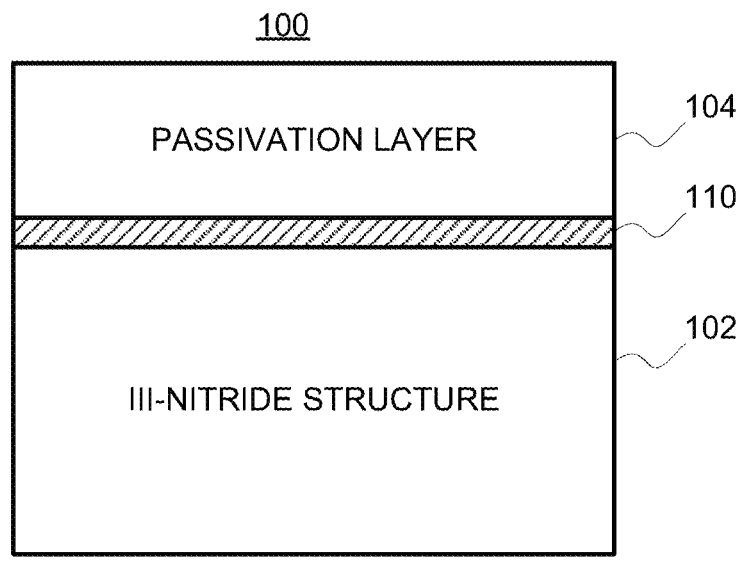
FIG. 1 shows a side cross-sectional view of an illustrative layered structure having a passivation layer formed over a III-nitride structure forming a rough interface, in accordance with some embodiments of the present disclosure.

FIG. 1 shows a side cross-sectional view of illustrative layered structure 100 having passivation layer 104 formed over III-nitride structure 102 forming rough interface 110, in accordance with some embodiments of the present disclosure. III-nitride structure 102, which may include a HEMT structure, may be formed on a suitable substrate such as gallium nitride, silicon carbide, sapphire, silicon, or any other suitable wafer. The III-nitride structure has an uppermost layer. Some illustrative examples of the uppermost layer include GaN, AlN, AlGaN, and InGaAlN. Passivation layer 104, which includes a dielectric material, is formed over III-nitride structure 102, forming interface 110. Interface 110 is rough, characterized by a transition from III-nitride structure 102 to passivation layer 104 that spans more than one atomic layer. For example, "rough" or "roughness"

refers to a metric for deviations in structure normal to an interface plane between III-nitride structure 102 and passivation layer 104. The metric includes, for example, a number of atomic layers or a distance over which the transition occurs. For comparison, a "smooth" interface includes an abrupt transition, exhibiting little to no deviation in structure from the interface plane. Accordingly, a smooth interface may introduce interfacial stress and increased density of interface states.

Figure 2:
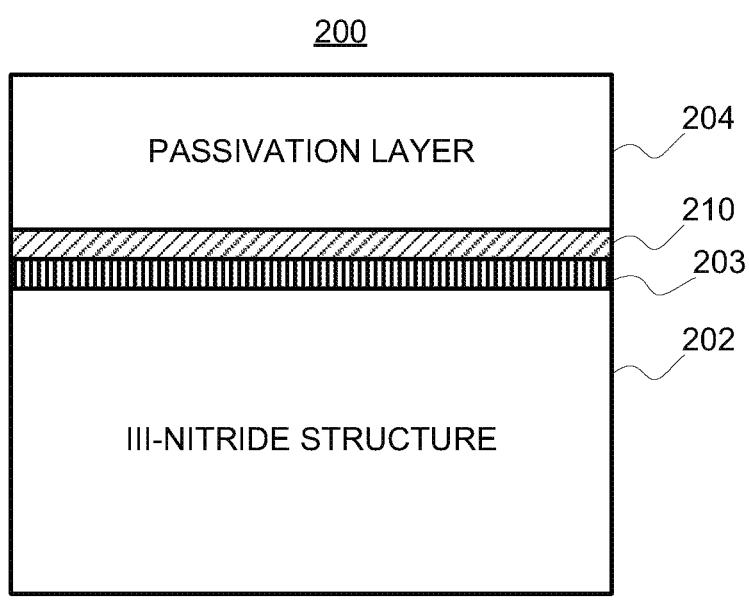
FIG. 2 shows a side cross-sectional view of an illustrative layered structure having a passivation layer formed over a preparatory layer forming a rough interface, in accordance with some embodiments of the present disclosure.

FIG. 2 shows a side cross-sectional view of illustrative layered structure 200 having passivation layer 204 formed over preparatory layer 203 forming rough interface 210, in accordance with some embodiments of the present disclosure. III-nitride structure 202, which may include a HEMT structure, may be formed on a suitable substrate such as, for example, gallium nitride, silicon carbide, sapphire, or a silicon wafer. Preparatory layer 203 is formed over III-nitride structure 202 to affect roughness in the subsequent formation of passivation layer 204. Passivation layer 204, which includes a dielectric material, is formed over surface layer 203, forming interface 210. Interface 210 is rough, characterized by a transition from preparatory layer 203 to passivation layer 204 that spans more than one atomic layer.

As illustrated in FIGS. 3-6, passivated layered structures formed with relatively rough interfaces between the passivation layer and the underlying semiconductor structure exhibit a lower density of interface states.

Figure 3:
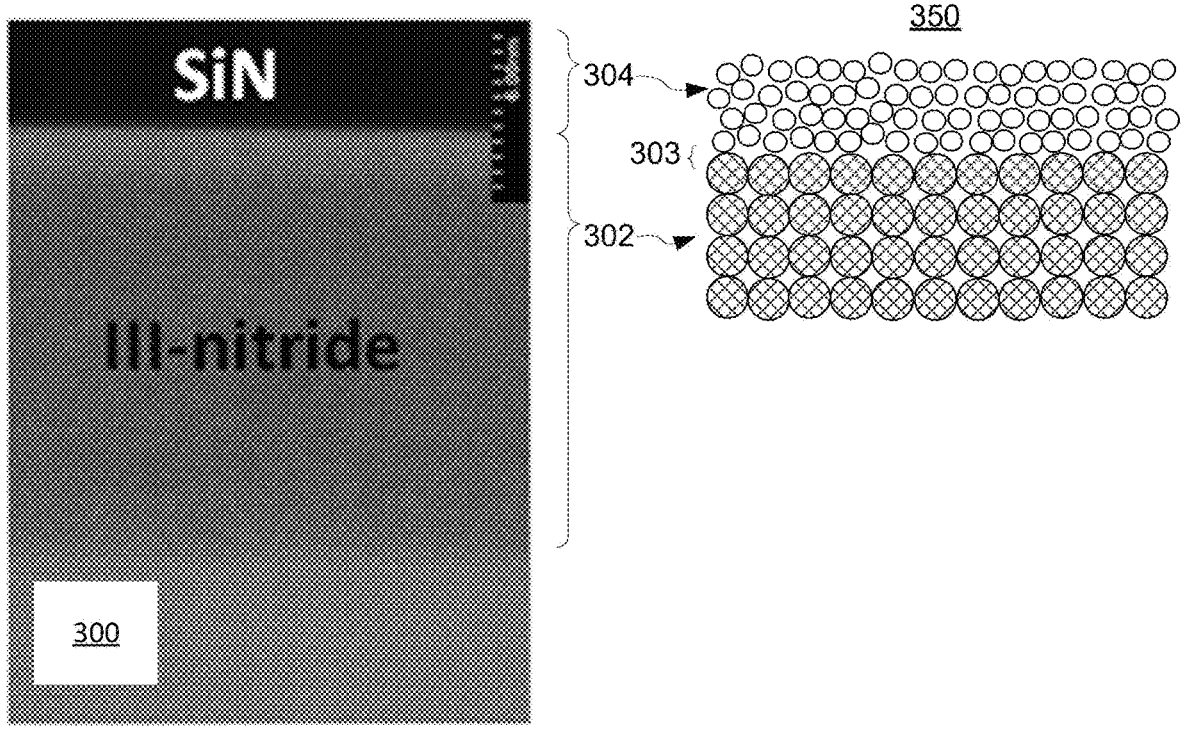
FIG. 3 shows a side cross-sectional transmission electron microscope (TEM) image of a layered structure having a smooth interface, and a corresponding illustration.

FIG. 3 shows a side cross-sectional TEM image of layered structure 300 having a smooth interface, and corresponding illustration 350. Layered structure 300 includes SiN passivation layer 304 formed over III-nitride structure 302 with smooth interface 303. Smooth interface 303 is characterized by a sharp transition from the semiconductor structure (e.g., III-nitride structure 302) to the dielectric layer (e.g., SiN passivation layer 304). The transition occurs within about one atomic layer, having a thickness of approximately 0.2-0.3 nm. As illustrated in FIG. 3, smooth interface 303 does not exhibit any discernable undulations.

In an illustrative example, illustration 350 shows a top layer (e.g., passivation layer 304) formed over a bottom layer (e.g., III-nitride structure 302) with a relatively smooth interface (e.g., smooth interface 303). The illustrative members, shown as circles in illustration 350, may represent atoms of a layer or groups of atoms of a layer (e.g., with members of the different layers represented by different circles). For example, as shown in illustration 350, smooth interface 303 exhibits a thickness of about one atomic layer or less.

Figure 4:
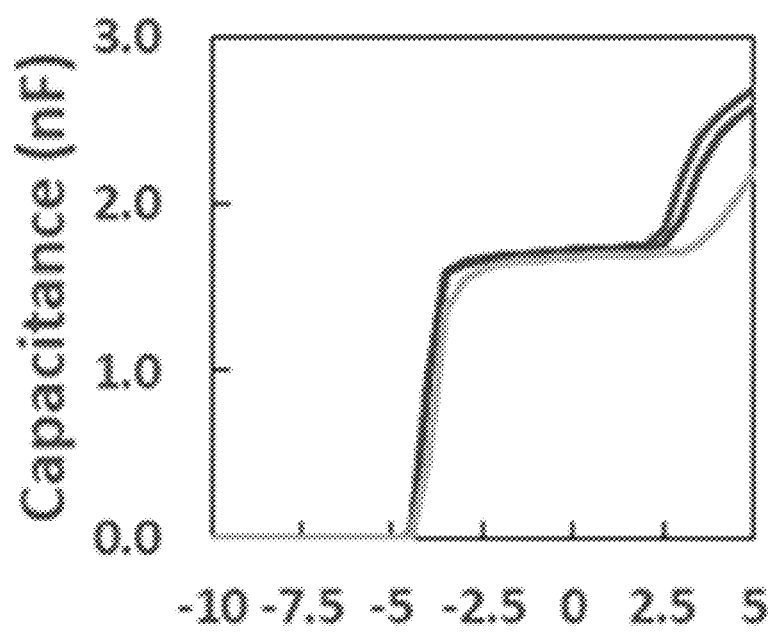
FIG. 4 shows a plot of capacitance-voltage characteristics measured at different frequencies for the layered structure of FIG. 3.

FIG. 4 shows plot 400 of capacitance-voltage characteristics measured at different frequencies for layered structure 300 of FIG. 3. Plot 400 includes data regarding frequency-dispersion capacitance-voltage (CV) characteristics. The interface states for a semiconductor structure may be characterized using frequency-dispersion CV measurements. A dispersion of the CV characteristics captured at different frequencies is associated with the interface states. A magnitude of the dispersion may be linked to a density of the interface states (e.g., larger dispersion is indicative of more interface states). As shown in FIG. 4, the CV characteristics of this passivated structure (e.g., layered structure 300) exhibit relatively large dispersion indicating a relatively high density of interface states. For example, the density of interface states for layered structure 300 is estimated to be $1 \times 10^{12}$ cm$^{-2}$ or higher.

Figure 5:
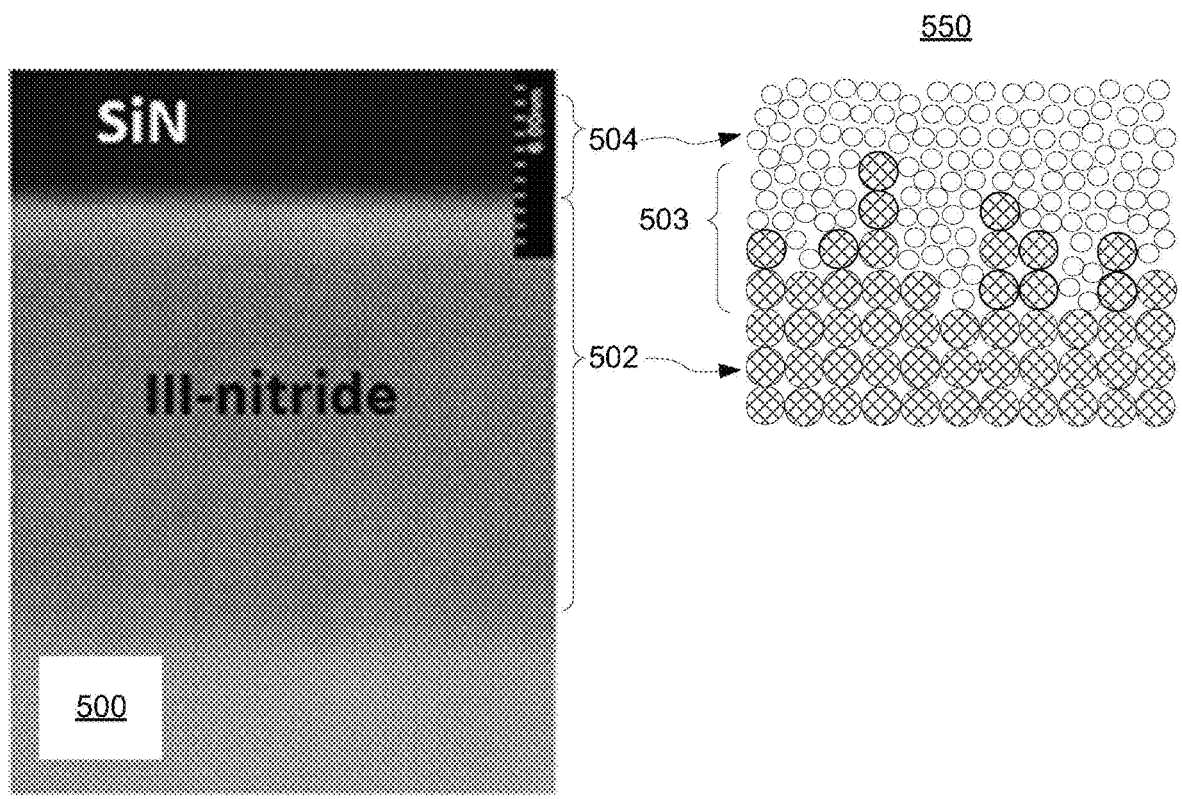
FIG. 5 shows a side cross-sectional TEM image of a layered structure having a rough interface, and a corresponding illustration, in accordance with some embodiments of the present disclosure.

FIG. 5 shows a side cross-sectional TEM image of layered structure 500 having a rough interface, in accordance with some embodiments of the present disclosure. Layered structure 500 includes SiN passivation layer 504 formed over III-nitride structure 502 with rough interface 503. Rough interface 503 is indicated by a seemingly gradual transition from the semiconductor structure (e.g., III-nitride structure 502) to the dielectric layer (e.g., SiN passivation layer 504). The gradual transition is formed by undulations of the atomic layers near the interface plane (e.g., where rough interface 503 is arranged). The undulations are evenly distributed in the interface plane and random in height. As shown in FIG. 5, the transition has a thickness of (e.g., the interface roughness) about 2-3 atomic layers, which corresponds to approximately 0.5-0.7 nm in this illustrative example. The interface roughness may be larger for other illustrative structures and applications, in accordance with the present disclosure.

In an illustrative example, illustration 550 shows a top layer (e.g., passivation layer 504) formed over a bottom layer (e.g., III-nitride structure 502) with a relatively rough interface (e.g., rough interface 503). The illustrative members, shown as circles in illustration 550, may represent atoms of a layer or groups of atoms of a layer (e.g., with members of the different layers represented by different circles). For example, as shown in illustration 550, rough interface 503 exhibits a thickness of more than one atomic layer.

Figure 6:
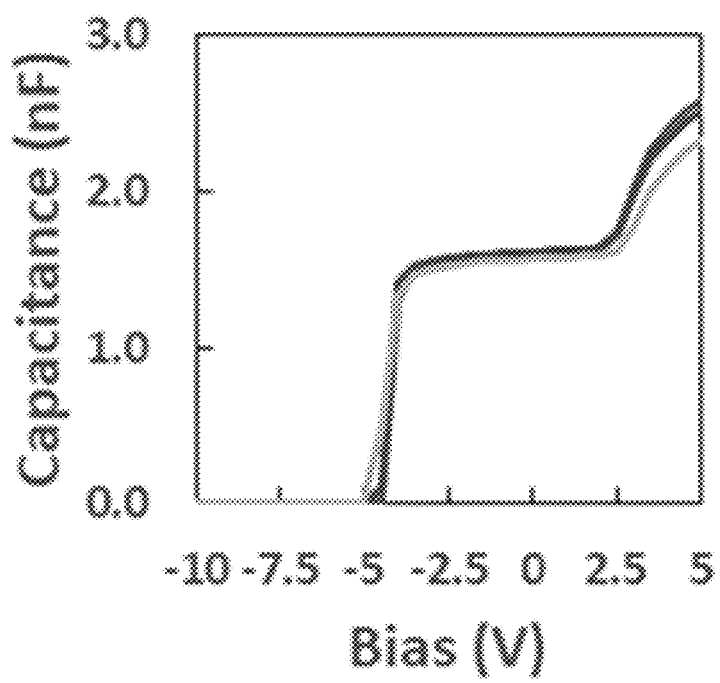
FIG. 6 shows a plot of capacitance-voltage characteristics measured at different frequencies for the layered structure of FIG. 5, in accordance with some embodiments of the present disclosure.

FIG. 6 shows a plot of capacitance-voltage characteristics measured at different frequencies for layered structure 500 of FIG. 5, in accordance with some embodiments of the present disclosure. As shown in FIG. 6, the CV characteristics of the passivated structure (e.g., layered structure 500) with rough interface 503 exhibit relatively small frequency-dispersion indicating a low density of interface states. The density of interface states for layered structure 500 is estimated to be $1 \times 10^{11}$ cm$^{-2}$ or lower.

Figure 7:
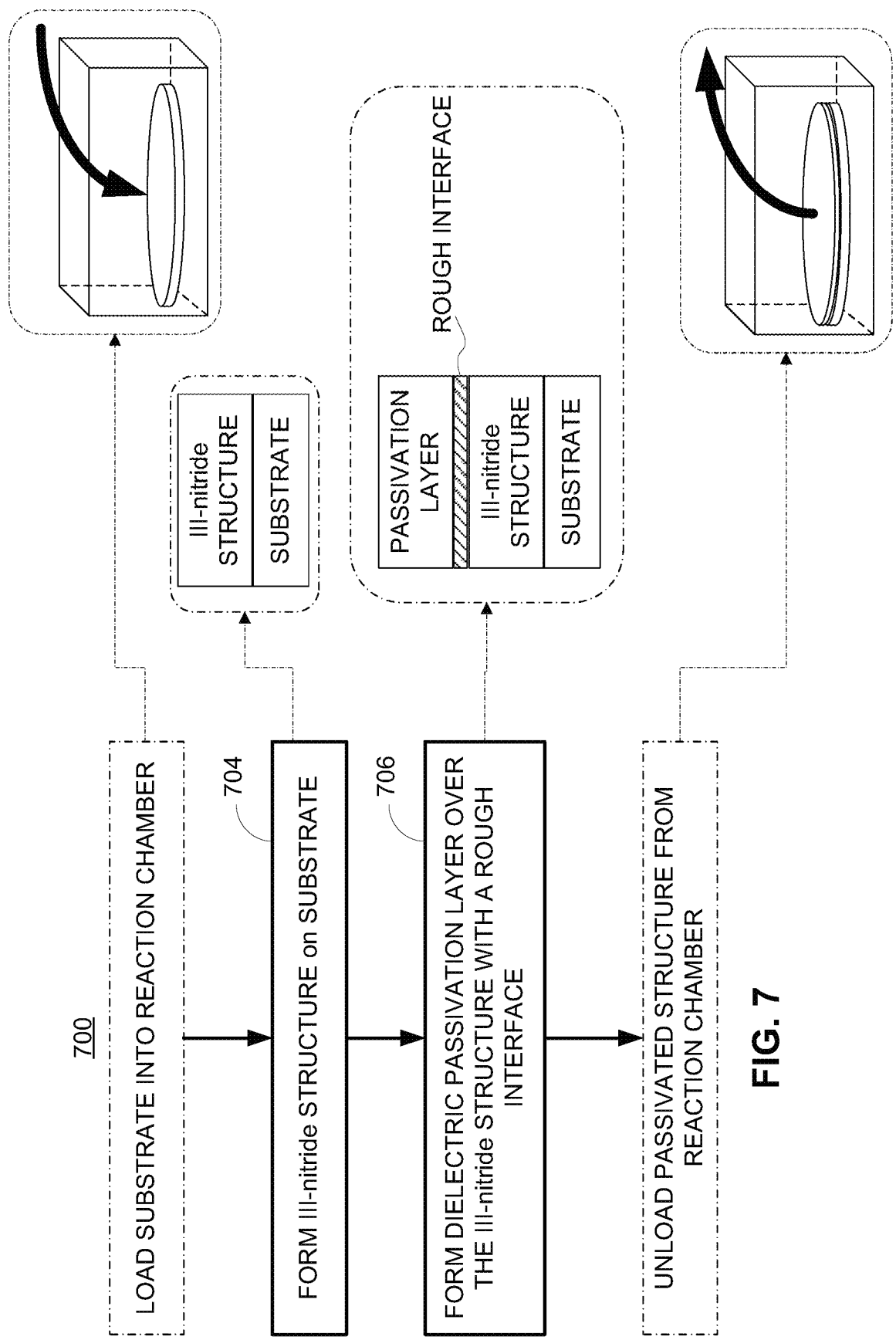
FIG. 7 is a flowchart of an illustrative process for making a layered structure, in accordance with some embodiments of the present disclosure.

FIG. 7 is a flowchart of illustrative process 700 for making a layered structure, in accordance with some embodiments of the present disclosure. Process 700 includes forming a dielectric-passivated, III-nitride structure with a rough dielectric-semiconductor interface, wherein the passivation layer is deposited directly on a semiconductor structure. The rough interface is formed during the dielectric deposition.

In some embodiments, a substrate is loaded into a suitable reactor chamber for forming a III-nitride structure over the substrate. The substrate may include gallium nitride, silicon carbide, sapphire, a silicon wafer, or any other suitable substrate, having a predetermined crystallographic orientation. At 704, a III-nitride structure is formed over the substrate in the reactor chamber. In some embodiments, the III-nitride structure (e.g., a HEMT structure) includes one or more epitaxial layers formed over the substrate. The deposition conditions for the III-nitride structure are selected so that smooth interfaces are formed between the layers of the structure. For example, the smooth interfaces are needed for high device performance. The uppermost layer of the III-nitride structure may also include a smooth surface prior to dielectric deposition.

At 706, a dielectric passivation layer is formed over the III-nitride structure, forming a rough dielectric-semiconductor interface. In some embodiments, 706 includes ex-situ deposition, wherein the dielectric passivation layer is deposited in a separate reactor chamber from 704. In some embodiments, 706 includes in-situ deposition. For example, in-situ deposition may be performed in a metal-organic chemical vapor deposition (MOCVD) chamber, a molecular beam epitaxy (MBE) chamber, or other suitable reactor chamber. The dielectric layer formed at 706 has a dielectric layer thickness. In some embodiments, for example, the thickness of the transition at the interface is at least equal to 0.5 nanometers and is less than the dielectric layer thickness.

In an illustrative example, a SiN layer may be deposited at 706 using chemical precursors such as silane and ammonia, disilane and ammonia, any other suitable precursors, or any combination thereof. To illustrate, the ammonia-to-silane or disilane or nitrogen-to-silicon molar flow ratio may be in the range of 50-3000. The passivation layer formed at 706 may have a thickness in the range of 1-1000 nm. Regarding process 700, the interface roughness between the passivation layer and III-nitride structure is formed during dielectric deposition at 706, when some suitable growth conditions are employed. For example, for in-situ SiN deposition, these conditions are high growth temperature (e.g., about 1000° C. and higher) and low nitrogen-source to silicon source ratio (e.g., low nitrogen source flow) of about 300 and lower. In an illustrative example, layer structure 100 of FIG. 1 may be formed by process 700.

In some embodiments, the passivated semiconductor structure is removed from the reactor chamber following passivation (e.g., formation of the dielectric layer at 706). In some embodiments, for example, the passivated structure may be forwarded to a metrology process, or other process to validate operation of the structure.

Figure 8:
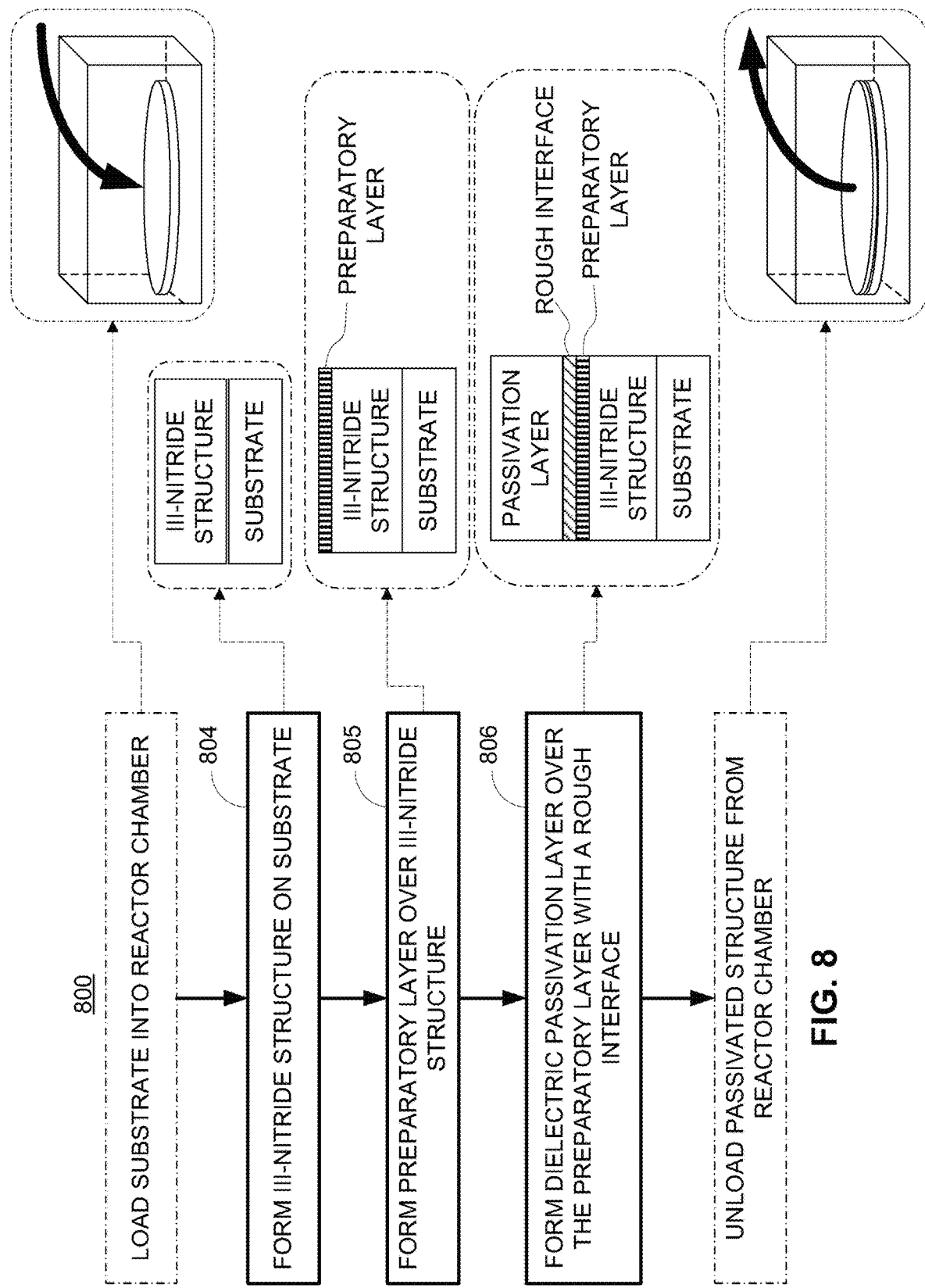
FIG. 8 is a flowchart of an illustrative process for making a layered structure with a preparatory layer, in accordance with some embodiments of the present disclosure.

FIG. 8 is a flowchart of illustrative process 800 for making a layered structure with an intermediate preparatory layer, in accordance with some embodiments of the present disclosure. Process 800 includes forming a dielectric-passivated, III-nitride structure with rough dielectric-semiconductor interface, wherein the passivation layer is deposited on a preparatory layer (i.e., the intermediate preparatory layer) over the semiconductor structure. The rough interface is formed during the preparatory layer formation and subsequent dielectric deposition.

In some embodiments, a substrate is loaded into a suitable reactor chamber for forming a III-nitride structure over the substrate. At 804, a III-nitride structure is formed over the substrate in the reactor chamber.

At 805, a preparatory layer is formed over the III-nitride structure. Interface roughness can be precipitated or enhanced by using a preparatory semiconductor layer. The preparatory layer may include III-nitride compounds having weak chemical bonds. In some embodiments, the preparatory layer may be formed with a rough surface opposite to the preparatory layer—III-nitride structure interface (e.g., the outer surface) during formation of the preparatory layer. In some embodiments, the surface opposite to the preparatory layer—III-nitride structure interface precipitates roughness during dielectric deposition at 806. Illustrative examples of preparatory layer materials include InN, GaN, InGaN, InAlN, InGaAlN, or other suitable materials. In some embodiments, the preparatory layer has a thickness of 0.5 nm or greater. In some embodiments, the interface between underlying III-nitride structure and the preparatory layer is smooth (e.g., the inner surface of the preparatory layer). The rough outer surface of the preparatory layer is used as a template for a subsequent deposition of the dielectric, thus forming the rough semiconductor-dielectric interface with the intermediate preparatory layer.

At 806, a dielectric passivation layer is formed over the preparatory layer, forming a rough interface. In some embodiments, formation of the dielectric passivation layer at 806 includes ex-situ deposition in a separate reactor chamber from that of 804. In some embodiments, formation of the dielectric passivation layer at 806 includes in-situ deposition. For example, in-situ deposition may be performed in a metal-organic chemical vapor deposition (MOCVD) chamber, a molecular beam epitaxy (MBE) chamber, or other suitable reactor chamber. The dielectric layer formed at 806 has a dielectric layer thickness. In some embodiments, for example, the thickness of the transition at the interface is at least equal to 0.5 nanometers and is less than the dielectric layer thickness.

In an illustrative example regarding processes 700 and 800, the passivation layer can be deposited directly on the III-nitride structure or on a preparatory layer which may be grown over the III-nitride structure. The dielectric-semiconductor interface roughness (e.g., a metric of thickness) is 0.5 nm or more in magnitude. The roughness is evenly distributed or homogeneous in the interface plane. In some embodiments, the roughness of the dielectric-to-III-nitride interface reduces interface stress, the density of interface states associated with stress, or both. A relatively low density of interface states enables high performance of the III-nitride structures and corresponding devices while operating at high frequencies. Accordingly, the improved dielectric passivation may result in improved high-frequency device operation.

The growth and/or deposition described herein may be performed using one or more of chemical vapor deposition (CVD), metalorganic chemical vapor deposition (MOCVD), organometallic vapor phase epitaxy (OMVPE), atomic layer deposition (ALD), molecular beam epitaxy (MBE), halide vapor phase epitaxy (HVPE), pulsed laser deposition (PLD), and/or physical vapor deposition (PVD).

As described herein, a layer means a substantially uniform thickness of a material covering a surface. A layer can be either continuous or discontinuous (i.e., having gaps between regions of the material). For example, a layer can completely or partially cover a surface, or be segmented into discrete regions, which collectively define the layer (i.e., regions formed using selective-area epitaxy).

Monolithically-integrated means formed on the surface of the substrate, typically by depositing layers disposed on the surface.

Disposed on means "exists on" or "over" an underlying material or layer. This layer may comprise intermediate layers, such as transitional layers, necessary to ensure a suitable surface. For example, if a material is described to be "disposed on" or "over a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal exhibits no twinning or anti-phase domains.

Single-phase means a crystalline structure that is both single-crystal and single-domain.

Substrate means the material on which deposited layers are formed. Exemplary substrates include, without limitation: bulk gallium nitride wafers, bulk silicon carbide wafers, bulk sapphire wafers, bulk germanium wafers, bulk silicon wafers, in which a wafer comprises a homogeneous thickness of single-crystal material; composite wafers, such as a silicon-on-insulator wafer that comprises a layer of silicon that is disposed on a layer of silicon dioxide that is disposed on a bulk silicon handle wafer; or the porous germanium, germanium over oxide and silicon, germanium over silicon, patterned germanium, germanium tin over germanium, and/or the like; or any other material that serves as base layer upon which, or in which, devices are formed. Examples of such other materials that are suitable, as a function of the application, for use as substrate layers and bulk substrates include, without limitation, alumina, gallium-arsenide, indium-phosphide, silica, silicon dioxide, borosilicate glass, and pyrex. A substrate may have a single bulk wafer, or multiple sub-layers. Specifically, a substrate (e.g., silicon, germanium, etc.) may include multiple non-continuous porous portions. The multiple non-continuous porous portions may have different densities and may be horizontally distributed or vertically layered.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20°. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Semiconductor refers to any solid substance that has a conductivity between that of an insulator and that of most metals. An example semiconductor layer is composed of silicon. The semiconductor layer may include a single bulk wafer, or multiple sub-layers. Specifically, a silicon semiconductor layer may include multiple non-continuous porous portions. The multiple non-continuous porous portions may have different densities and may be horizontally distributed or vertically layered.

A first layer described and/or depicted herein as "configured on," "on," "formed over," or "over" a second layer can be immediately adjacent to the second layer, or one or more intervening layers can be between the first and second layers. A first layer that is described and/or depicted herein as "directly on" or "directly over" a second layer or a substrate is immediately adjacent to the second layer or substrate with no intervening layer present, other than possibly an intervening alloy layer that may form due to mixing of the first layer with the second layer or substrate. In addition, a first layer that is described and/or depicted herein as being "on," "over," "directly on," or "directly over" a second layer or substrate may cover the entire second layer or substrate, or a portion of the second layer or substrate.

A substrate is placed on a substrate holder during layer growth, and so a top surface or an upper surface is the surface of the substrate or layer furthest from the substrate holder, while a bottom surface or a lower surface is the surface of the substrate or layer nearest to the substrate holder. Any of the structures depicted and described herein can be part of larger structures with additional layers above and/or below those depicted. For clarity, the figures herein can omit these additional layers, although these additional layers can be part of the structures disclosed. In addition, the structures depicted can be repeated in units, even if this repetition is not depicted in the figures.

From the above description it is manifest that various techniques may be used for implementing the concepts described herein without departing from the scope of the disclosure. The described embodiments are to be considered in all respects as illustrative and not restrictive. It should also be understood that the techniques and structures described herein are not limited to the particular examples described herein, but can be implemented in other examples without departing from the scope of the disclosure. Similarly, while operations are depicted in the drawings in a particular order, this should not be understood as requiring that such operations be performed in the particular order shown or in sequential order, or that all illustrated operations be performed, to achieve desirable results.

What is claimed is:

1. A passivated semiconductor device structure comprising:
   a III-nitride high electron mobility transistor (HEMT) structure; and
   a dielectric layer formed over the HEMT structure to provide passivation and forming a rough interface with the HEMT structure, wherein:
      the rough interface comprises a rough transition having a thickness of at least two atomic layers and a surface roughness spanning at least two atomic layers, and
      the rough interface comprises interface states, wherein a density of the interface states is less than a reference density of interface states, wherein the reference density corresponds to a smooth transition having a thickness of at most one atomic layer, and wherein the density of interface states is at most equal to $1 \times 10^{11}$ cm$^{-2}$.

2. The passivated semiconductor device structure of claim 1, wherein the dielectric layer comprises a material of the group consisting of SiN, SiAlN, SiO$_2$, Al$_2$O$_3$, and HfO$_2$.

3. The passivated semiconductor device structure of claim 1, wherein the dielectric layer is formed using an in-situ deposition technique.

4. The passivated semiconductor device structure of claim 1, wherein the dielectric layer comprises a thickness ranging from 1-1000 nanometers.

5. The passivated semiconductor device structure of claim 1, wherein the dielectric layer comprises a dielectric layer thickness, wherein the thickness of the rough transition is at least equal to 0.5 nanometers, and wherein the thickness of the rough transition is less than the dielectric layer thickness.

6. The passivated semiconductor device structure of claim 1, wherein the rough transition lies in an interface plane, and wherein the thickness of the rough transition is substantially homogenous in the interface plane.

7. The passivated semiconductor device structure of claim 1, wherein the dielectric layer is formed by deposition directly on the HEMT structure.

8. The passivated semiconductor device structure of claim 1, wherein the HEMT structure comprises an uppermost layer at the rough interface, and wherein the uppermost layer comprises a material of the group consisting of GaN, AlN, AlGaN, and InGaAlN.

9. The passivated semiconductor device structure of claim 1, wherein:
   the HEMT structure further comprises a preparatory layer formed over the III-nitride HEMT structure,
   the dielectric layer is formed by deposition over the preparatory layer, and
   the preparatory layer and the dielectric layer form the rough interface.

10. The passivated semiconductor device structure of claim 9, wherein the preparatory layer comprises a material of the group consisting of a III-nitride semiconductor, InN, InGaN, InAlN, InGaAlN, and GaN.

11. The passivated semiconductor device structure of claim 9, wherein the preparatory layer provides the rough transition at the rough interface.

12. The passivated semiconductor device structure of claim 9, wherein the preparatory layer comprises a thickness at least equal to 0.5 nanometers.

13. The passivated semiconductor device structure of claim 1, wherein the density of interface states is at most equal to $1 \times 10^{10}$ cm$^{-2}$.

14. The passivated semiconductor device structure of claim 1, wherein the surface roughness spans at least four atomic layers.

15. A passivated semiconductor device structure comprising:
   a III-nitride high electron mobility transistor (HEMT) structure;
   a preparatory layer formed over the III-nitride HEMT structure configured to provide surface roughness; and
   a dielectric layer formed over the preparatory layer to provide passivation for the III-nitride HEMT structure, wherein:
      the preparatory layer and the dielectric layer form a rough interface,
      the rough interface comprises a rough transition having a thickness of at least two atomic layers and a surface roughness spanning at least two atomic layers, and
      the rough interface comprises interface states, wherein a density of the interface states is less than a reference density of interface states, wherein the reference density corresponds to a smooth transition of at most one atomic layer thickness, and wherein the density of interface states is at most equal to $1 \times 10^{11}$ cm$^{-2}$.

16. The passivated semiconductor device structure of claim 15, wherein the dielectric layer comprises a dielectric layer thickness, wherein the thickness of the rough transition is at least equal to 0.5 nanometers, and wherein the thickness of the rough transition is less than the dielectric layer thickness.

17. A method for making a passivated semiconductor device structure, the method comprising:
   forming a structure comprising a III-nitride high electron mobility transistor (HEMT) structure; and
   forming a dielectric layer over the structure to provide passivation and form a rough interface with the III-nitride HEMT structure, wherein:
      the rough interface comprises a rough transition having a thickness of at least two atomic layers and a surface roughness spanning at least two atomic layers,
      the rough interface comprises interface states, wherein a density of the interface states is less than a reference density of interface states, wherein the reference density corresponds to a smooth transition of at most one atomic layer, wherein the density of interface states is at most equal to $1 \times 10^{11}$ cm$^{-2}$, and
      the dielectric layer is formed by direct deposition.

18. The method of claim 17, further comprising:
   forming a preparatory layer over the III-nitride HEMT structure; and
   forming the dielectric layer by deposition over the preparatory layer, wherein the preparatory layer and the dielectric layer form the rough interface.

19. The method of claim 17, wherein forming the dielectric layer comprises using an in-situ deposition technique.

20. The method of claim 19, wherein the deposition technique comprises one of metal-organic chemical vapor deposition (MOCVD) and molecular beam epitaxy (MBE).

* * * * *